(12) United States Patent  
Ise (10) Patent No.: US 7,187,065 B2  
(45) Date of Patent: Mar. 6, 2007

(54) SEMICONDUCTOR DEVICE AND SEMICONDUCTOR DEVICE UNIT

(75) Inventor: Hisao Ise, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 119 days.

(21) Appl. No.: 11/034,760

(22) Filed: Jan. 14, 2005

(65) Prior Publication Data

US 2006/0060951 A1 Mar. 23, 2006

(30) Foreign Application Priority Data

Sep. 17, 2004 (JP) ............................. 2004-271910

(51) Int. Cl.
*H01L 23/495* (2006.01)
(52) U.S. Cl. ............... 257/670; 257/666; 257/E23.043; 257/E23.048
(58) Field of Classification Search ................. 257/670
See application file for complete search history.

(56) References Cited

U.S. PATENT DOCUMENTS

2002/0140064 A1*  10/2002  Wu et al. .................. 257/670
2003/0127711 A1*  7/2003  Kawai et al. ............... 257/666
2004/0164408 A1*  8/2004  Yang .......................... 257/724
2005/0029640 A1*  2/2005  Amano et al. .............. 257/678

FOREIGN PATENT DOCUMENTS

| JP | 7-30067 | 1/1995 |
| JP | 9-293822 | 11/1997 |

* cited by examiner

*Primary Examiner*—Tu-Tu Ho
(74) *Attorney, Agent, or Firm*—Westerman, Hattori, Daniels & Adrian, LLP.

(57) ABSTRACT

A semiconductor device comprises a semiconductor chip which is mounted on a stage. A plurality of leads are electrically connected with the semiconductor chip. A package encloses the semiconductor chip and a part of the plurality of leads. A first corner lead is provided in the stage and outwardly extends from at least one of vertex portions at four corners of the stage to an exterior of the package.

8 Claims, 7 Drawing Sheets

SEMICONDUCTOR DEVICE AND SEMICONDUCTOR DEVICE UNIT

CROSS-REFERENCE TO RELATED APPLICATIONS

This application is based upon and claims the benefit of priority of Japanese Patent Application No. 2004-271910, filed on Sep. 17, 2004, the entire contents of which are herein incorporated by reference.

BACKGROUND OF THE INVENTION

1. Field of the Invention

The present invention generally relates to a semiconductor device and semiconductor device unit, and more particularly to a semiconductor device and semiconductor device unit which can provide high-density arrangement.

2. Description of the Related Art

In recent years, the semiconductor device with advanced functions and multiple bit features has been rapidly proliferated, and, in connection with this, the number of the leads tends to be increased.

On the other hand, the miniaturization of the semiconductor device is demanded, and it is necessary to adopt the smaller pitch of the leads. Therefore, it is desirable to provide the semiconductor device which can meet both the demands.

For example, there are the conventional semiconductor devices that are known from Japanese Laid-Open Patent Applications No. 09-293822 and No. 07-030067. These semiconductor devices have the composition in which the semiconductor chip, the stage, the lead, the wire, etc. are encapsulated in the resin package.

The semiconductor device of Japanese Laid-Open Patent Application No. 09-293822 comprises the lead frame for transferring an electrical signal, the auxiliary VSS power-supply semiconductor supporting lead frame on which the semiconductor chip is mounted, and the main VDD power-supply lead frame formed in the frame-like shape at the upper part of the semiconductor supporting lead frame. And the signal electrodes formed on the semiconductor chip are connected to the electrical-signal transmission lead frame by the wires.

Moreover, the power-supply electrodes on the semiconductor chip are connected to the VSS power-supply semiconductor supporting lead frame or the VDD power-supply lead frame by the wires. Furthermore, the semiconductor supporting lead frame is provided with the outwardly extended portions extending along the diagonal line linking two of the four corners of the semiconductor supporting lead frame.

On the other hand, the semiconductor device of Japanese Laid-Open Patent Applications No. 07-030067 has the composition in which the semiconductor chip is mounted on the metal tab. Moreover, the frame-like metal layer is formed on the metal tab so that the metal layer surrounds the semiconductor chip on the metal tab via the insulation layer.

The leads are arranged on the periphery of the metal layer so that the metal layer is surrounded by the leads. The leads are connected to the electrodes of the semiconductor chip, the tab, and the metal layer by the bonding wires. Moreover, the metal tab is provided with the outwardly extended portions which extend from the four corners of the tab.

However, in the conventional semiconductor devices mentioned above, the outwardly extended portions extending along the diagonal line linking two of the four corners of the semiconductor supporting lead frame as in Japanese Laid-Open Patent Applications No. 09-293822, and the outwardly extended portions which extend from the four corners of the metal tab as in Japanese Laid-Open Patent Applications No. 07-030067 are cut away after formation of the package and they do not serve as the external connection terminals.

For this reason, the layout of the leads arranged on the periphery of the semiconductor device package is such that the density of the leads at the four-corner positions of the package is small and the density of the leads at the side portions of the package other than the four corners is large. Therefore, in the conventional semiconductor devices, the entire circumference of the package is not effectively used for the arrangement of the leads, and there is the problem that the size of the semiconductor device is increased.

Moreover, in connection with the high-density arrangement of the semiconductor device as mentioned above, the lead pitch becomes narrow and the width of the lead itself also becomes narrow. Hence, the width of the leads connected to the power supply and the ground also becomes narrow. On the other hand, in order to raise the electrical properties of the semiconductor device, it is desirable that the leads connected to the power supply and the ground have low impedance.

However, it is difficult for the conventional semiconductor devices to attain low impedance of the leads connected to the power supply and the ground, and there is the problem that the electrical properties deteriorate.

SUMMARY OF THE INVENTION

An object of the present invention is to provide an improved semiconductor device in which the above-mentioned problems are eliminated.

Another object of the present invention is to provide a semiconductor device and semiconductor device unit which can attain high-density arrangement of the leads and the miniaturization of the device.

In order to achieve the above-mentioned objects, the present invention provides a semiconductor device which comprises: a semiconductor chip mounted on a stage; a plurality of leads electrically connected with the semiconductor chip; a package enclosing the semiconductor chip and a part of the plurality of leads; and a first corner lead provided in the stage and outwardly extending from at least one of vertex portions at four corners of the stage to an exterior of the package.

According to the present invention, the first corner lead is provided at any of the four corners of the stage which is not used as the arrangement position of the lead conventionally, and high-density arrangement of leads can be attained while the miniaturization of the semiconductor device can be attained.

The above-mentioned semiconductor device may be configured so that the first corner lead is used as either a power-supply lead or a ground lead.

According to the present invention, the first corner lead is formed at any of the four corners of the stage where a comparatively large space can be used, and it is possible to make the lead width large. Therefore, by using the first corner lead as the power supply lead or the ground lead, the impedance of the first corner lead used as the power supply or the ground can be reduced, and the electrical properties of the semiconductor device can be raised.

The above-mentioned semiconductor device may be configured so that the semiconductor device further comprises:

an outer peripheral lead surrounding an outer periphery of the stage; and a second corner lead provided in the outer peripheral lead and outwardly extending to the exterior of the package from a position of the outer peripheral lead corresponding to the at least one of vertex portions of the stage.

According to the present invention, the outer peripheral lead which surrounds the stage on which the semiconductor chip is mounted is provided, and wire connection between the semiconductor chip and the outer peripheral lead can be made at any position on the semiconductor chip. Therefore, flexibility can be given to the arrangement position of the power supply electrode and the ground electrode arranged on the semiconductor chip, and the design of the semiconductor chip and the wire layout can be attained easily.

The above-mentioned semiconductor device may be configured so that the first corner lead and the second corner lead are arranged side by side so that the first corner lead and the second corner lead are flush with the stage.

According to the present invention, the first corner lead and the second corner lead are arranged so that they are flush with the stage, and even when the plurality of corner leads are provided, the slim structure of the semiconductor device can be attained. Moreover, the height of the leads which are subjected to the wire bonding process is maintained at a fixed height, and it is possible to attain easy wire bonding process.

The above-mentioned semiconductor device may be configured so that the first corner lead and the second corner lead are laminated with an insulation layer interposed between the first corner lead and the second corner lead.

According to the present invention, the corner leads are formed at the four corners of the stage where a comparatively large space can be used, and the corner leads can have a large width and it is possible to provide low impedance of the leads. Therefore, the impedance of the corner leads which are used as the power supply lead or the ground lead can be reduced, and it is possible to raise the electrical properties of the semiconductor device.

Moreover, the first corner lead and the second corner lead are laminated with the insulation layer interposed between the first corner lead and the second corner lead, and it is possible to arrange the first and second corner leads in the width corresponding to a single lead width, and high-density arrangement of the leads can be attained.

The above-mentioned semiconductor device may be configured so that the first corner lead and the second corner lead have different lengths at their leading edges.

According to the present invention, the position of the leading edge of the first corner lead differs from the position of the leading edge of the second corner lead, and each corner lead can be easily bonded to the mounting substrate on which the semiconductor device is mounted.

The above-mentioned semiconductor device may be configured so that the first corner lead and the second corner lead have leading edges which are arranged in an L-shaped formation and are symmetrical with respect to the insulation layer.

According to the present invention, the leading edges of the first and the second corner leads are extended symmetrically with respect to the insulation layer in the mutually opposite directions, and this makes it possible to easily perform the bonding of the semiconductor device to the mounting substrate in the mounting proceeding.

Furthermore, in order to achieve the above-mentioned objects, the present invention provides a semiconductor device unit which includes a semiconductor device, a mounting substrate, and an external addition circuit, the semiconductor device comprising: a semiconductor chip mounted on a stage; a plurality of leads electrically connected with the semiconductor chip; a package enclosing the semiconductor chip and a part of the plurality of leads; and a first corner lead provided in the stage and outwardly extending from at least one of vertex portions at four corners of the stage to an exterior of the package, wherein the semiconductor device is mounted on the mounting substrate, and the external addition circuit is arranged on the mounting substrate in a vicinity of the first corner lead of the semiconductor device and connected to the semiconductor chip.

According to the present invention, the external addition circuit is formed at any of the four corners of the stage where a comparatively large space can be used. Even when the external addition circuit has to be mounted, it is possible to prevent the size of the semiconductor device unit from being increased. Moreover, the external addition circuit is arranged in the vicinity of the first corner lead, and the impedance between the external addition circuit and the first corner lead can be reduced, and it is possible to aim at improvement in the electrical properties between them.

As described above, according to the present invention, the vertex portions of the stage which are the four-corner positions of the stage are effectively used for the arrangement of the leads, and it is possible to attain high-density arrangement of the leads as well as the miniaturization of the semiconductor device.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 1:
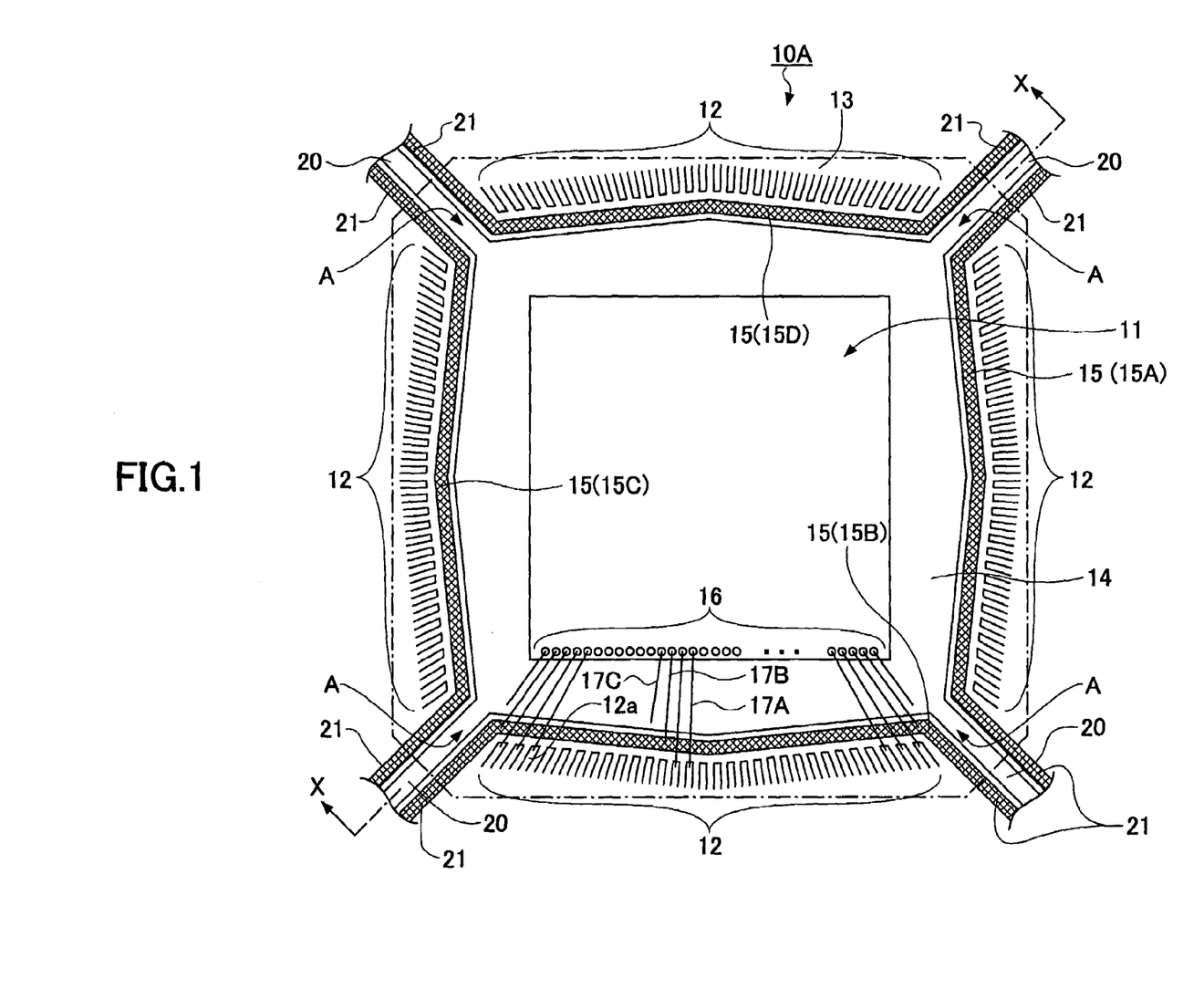
FIG. 1 is a diagram showing the composition of the semiconductor device in the first preferred embodiment of the invention in the state where the resin package is considered transparent.
Figure 2:
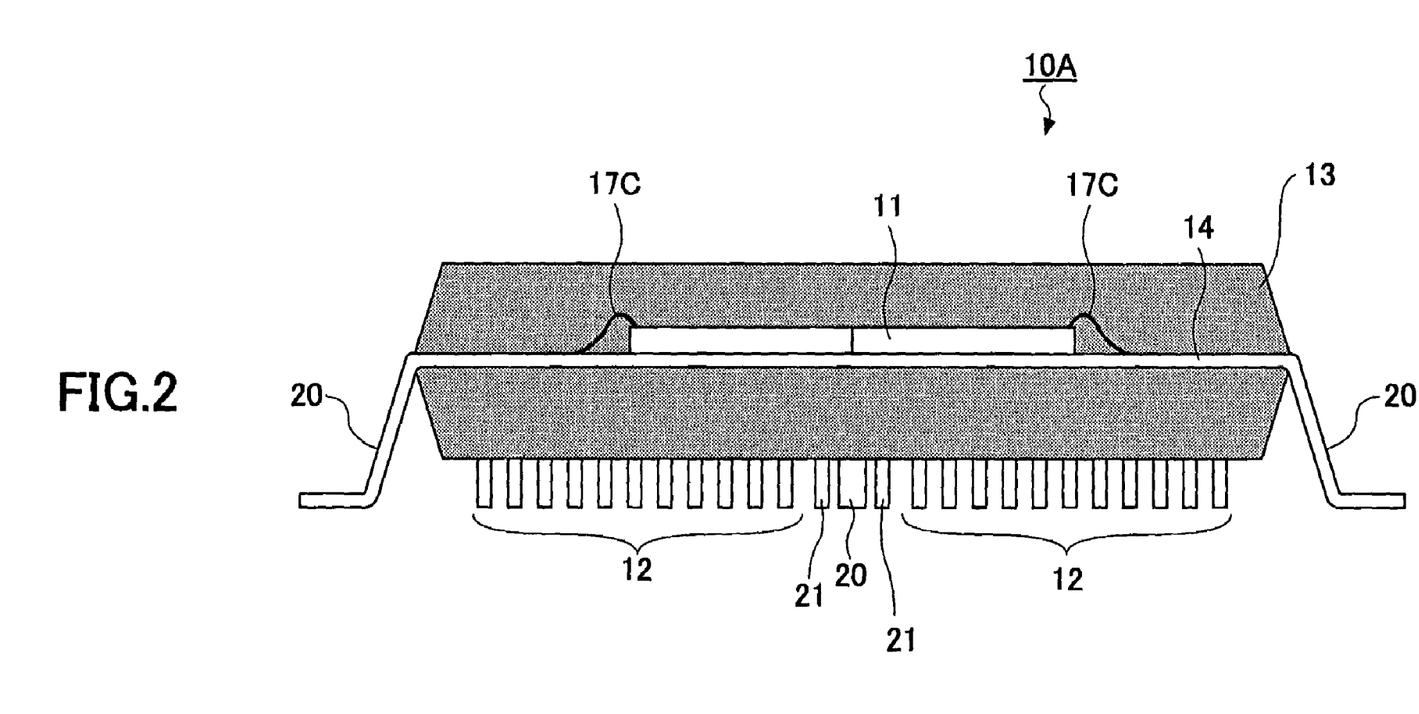
FIG. 2 is a cross-sectional view of the semiconductor device in the first preferred embodiment.
Figure 3:
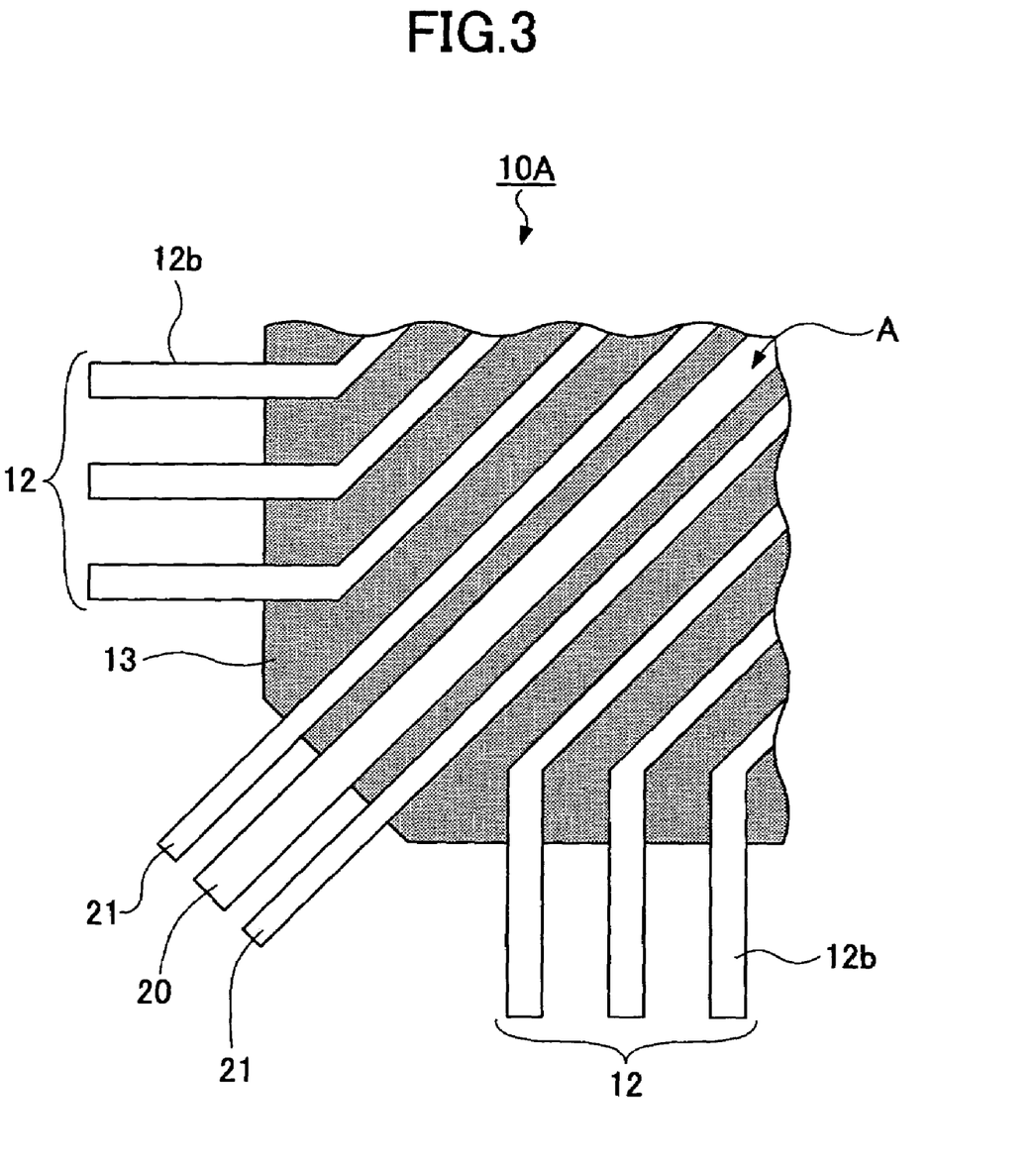
FIG. 3 is a diagram for explaining the arrangement of the leads at the vertex portion of the semiconductor device in the first preferred embodiment.

With reference to FIG. 1 through FIG. 3, the composition of the semiconductor device 10A in the first preferred embodiment of the invention will be explained.

FIG. 1 shows the principal part of the semiconductor device 10A in the state where the resin package 13 is considered transparent, FIG. 2 is a cross-sectional view of the semiconductor device 10A taken along the line X—X in FIG. 1, and FIG. 3 is a diagram for explaining the arrangement of the leads at the vertex portions of the semiconductor device 10A. The arrangement of the leads will be explained later.

The semiconductor device 10A has the QFP (Quad Flat Package) structure, and the semiconductor device 10A generally comprises the semiconductor chip 11, the leads 12, the resin package 13, the stage 14, and the outer peripheral leads 15.

The semiconductor chip 11 is composed at high density, and it has many electrode pads 16 on the circuit formation surface (which is in this embodiment the upper surface) of the semiconductor ship 11. The semiconductor chip 11 is bonded to the stage 14 using the adhesive agent which is not illustrated.

The leads 12 comprise the inner lead portions 12a and the outer lead portions 12b, and are arranged around the periphery of the semiconductor chip 11. The inner lead portions 12a (shown in FIG. 1) of the leads 12 are connected to the signal electrode pads 16 of the semiconductor chip 11 by the wires 17A. Moreover, the outer lead portions 12b (shown in FIG. 3) of the leads 12 are outwardly extended to the exterior of the resin package 13. The outer lead portions 12b serve as the mounting terminals.

In the present embodiment, the outer lead portions 12b of the leads 12 are arranged in a gull-wing formation. The leads 12 are arranged around the periphery of the semiconductor chip 11 so that they confront the four sides of the stage 14 which is generally in the shape of a rectangle. Therefore, none of the leads 12 is arranged at the vertex portions (indicated by the arrow A in FIG. 1), which are the four-corner positions of the stage 14.

The stage 14 is made of a conductive metal (for example, a copper alloy), and the semiconductor chip 11 is mounted on the upper surface of the stage 14 by the adhesive agent as mentioned above.

The stage 14 is generally in the shape of a rectangle, and the stage 14 is provided with the first corner leads 20 which are outwardly extended from the vertex portions A which are located at the four-corner positions of the stage 14. In the present embodiment, the first corner leads 20 are formed at all of the four vertex portions A which are the four-corner positions of the stage 14.

The first corner leads 20 have a width that is larger than the width of the leads 12, and, therefore, the first corner leads 20 have an impedance that is lower than the impedance of the leads 12.

Moreover, the stage 14 is connected to the ground electrode pad 16 on the semiconductor chip 11 by the wire 17C. In addition, it is not necessarily required that the first corner leads 20 be formed at all of the vertex portions A of the stage 14. Alternatively, the first corner lead 20 may be formed at least one of the vertex portions A of the stage 14. Also, it is possible to suitably choose the desired number of the first corner leads 20 being arranged.

The outer peripheral leads 15 comprise the four division lead portions 15A to 15D, and the division lead portions are made of a conductive metal. The division lead portions 15A to 15D are arranged on the outer periphery of the stage 14 respectively.

Specifically, the outer peripheral leads 15 which comprise the division lead portions 15A–15D are located at the peripheral positions of the stage 14 and arranged at the positions inside the leading edges of the leads 12.

Moreover, the outer peripheral leads 15 and the stage 14 are arranged so that the outer peripheral leads 15 are flush with the stage 14. Namely, the height of the outer peripheral leads 15 when viewing the semiconductor device sidewise is equal to the height of the stage 14.

The second corner leads 21 are formed on the both sides of each of the division lead portions 15A to 15D which constitute the outer peripheral leads 15. Each of the second corner leads 21 is arranged so that the second corner lead 21 outwardly extends from the position corresponding to the vertex portion A to the exterior of the resin package 13.

The position corresponding to the vertex portion A means the position in the vicinity of the vertex portion A and in the vicinity of the first corner lead 20. In the present embodiment, when the vertex portion A is viewed from the top, the second corner leads 21 are located on the both sides of the first corner leads 20.

Moreover, the first corner lead 20 and the second corner leads 21 are arranged side by side so that the leads 20 and 21 are outwardly extended to the exterior of the resin package 13. The outer peripheral leads 15 are connected to the power-supply electrode pad 16 on the semiconductor chip 11 by wire 17B.

The resin package 13 is formed so that the semiconductor chip 11, the inner leads 12a, the stage 14, the outer peripheral leads 15, and the wires 17A–17C are encapsulated in the resin package 13. Thereby, the components 11, 12a, 14, 15, 17A–17C of the semiconductor device 10A are protected by the resin package 13.

As shown in FIG. 1, the resin package 13 is generally in the shape of a rectangle, and the first and second corner leads 20 and 21 are arranged side by side so that these leads are outwardly extended from the four-corner positions of the resin package 13 which correspond to the positions of the vertex portions A of the rectangle.

Moreover, the extended portions of the first and second corner leads 20 and 21 which extend from the resin package 13 are arranged in a gull-wing formation similar to that of the outer lead portions of the leads 12 mentioned above.

The semiconductor device 10A in this embodiment is provided with the first corner leads 20 which are outwardly extended from the vertex portions A of the stage 14 to the exterior of the resin package 13. The first corner portions 20 are integrally formed with the stage 14, and the stage 14 is connected to the ground electrode of the semiconductor chip 11 by the wire 17C. Therefore, the first corner leads 20 are used as the ground lead.

Moreover, the vertex portions A where the first and second corner leads 20 and 21 are arranged are the positions which are conventionally not used as the arrangement positions of the leads. According to this embodiment, the first corner leads 20 are arranged at such vertex portions A and the second corner leads 21 are arranged at the positions corresponding to the vertex portions A, and, therefore, high-density arrangement of the leads can be attained while the miniaturization of the semiconductor device 10A can be attained.

Moreover, the first and second corner leads 20 and 21 are arranged at the vertex portions A and the positions corresponding to the vertex portions A where a comparatively large space can be used, and the width of each of the leads 20 and 21 can be made large. Therefore, it is possible to attain low impedance of the leads 20 and 21.

In the present embodiment, the first corner leads 20 are used as the ground lead and the second corner leads 21 are used as the power supply lead. Therefore, the electrical properties of the semiconductor device 10A can be raised by reducing the impedance of the respective leads 20 and 21.

Moreover, in the present embodiment, the outer peripheral leads 15 are arranged so that the outer peripheral leads 15 surround the periphery of the stage 14 on which the semiconductor chip 11 is mounted. The wire connection between the semiconductor chip 11 and the outer peripheral lead 15 can be made at any position on the semiconductor chip 11. Therefore, flexibility can be given to the arrangement positions of the power supply electrode and the ground electrode arranged on the semiconductor chip 11, and the design of the semiconductor chip 11 and the wire layout can be attained easily.

Furthermore, in the semiconductor device 10A in the present embodiment, the first corner leads 20 and the second corner leads 21 are arranged side by side so that the first corner leads 20 and the second corner leads 21 are flush with the stage 14. Even when the plurality of corner leads 20 and 21 are provided, the slim structure of the semiconductor device 10A can be attained.

Moreover, the height of the leads which are subjected to the wire bonding process is maintained as a fixed height, and it is possible to attain easy wire bonding process.

Figure 4:
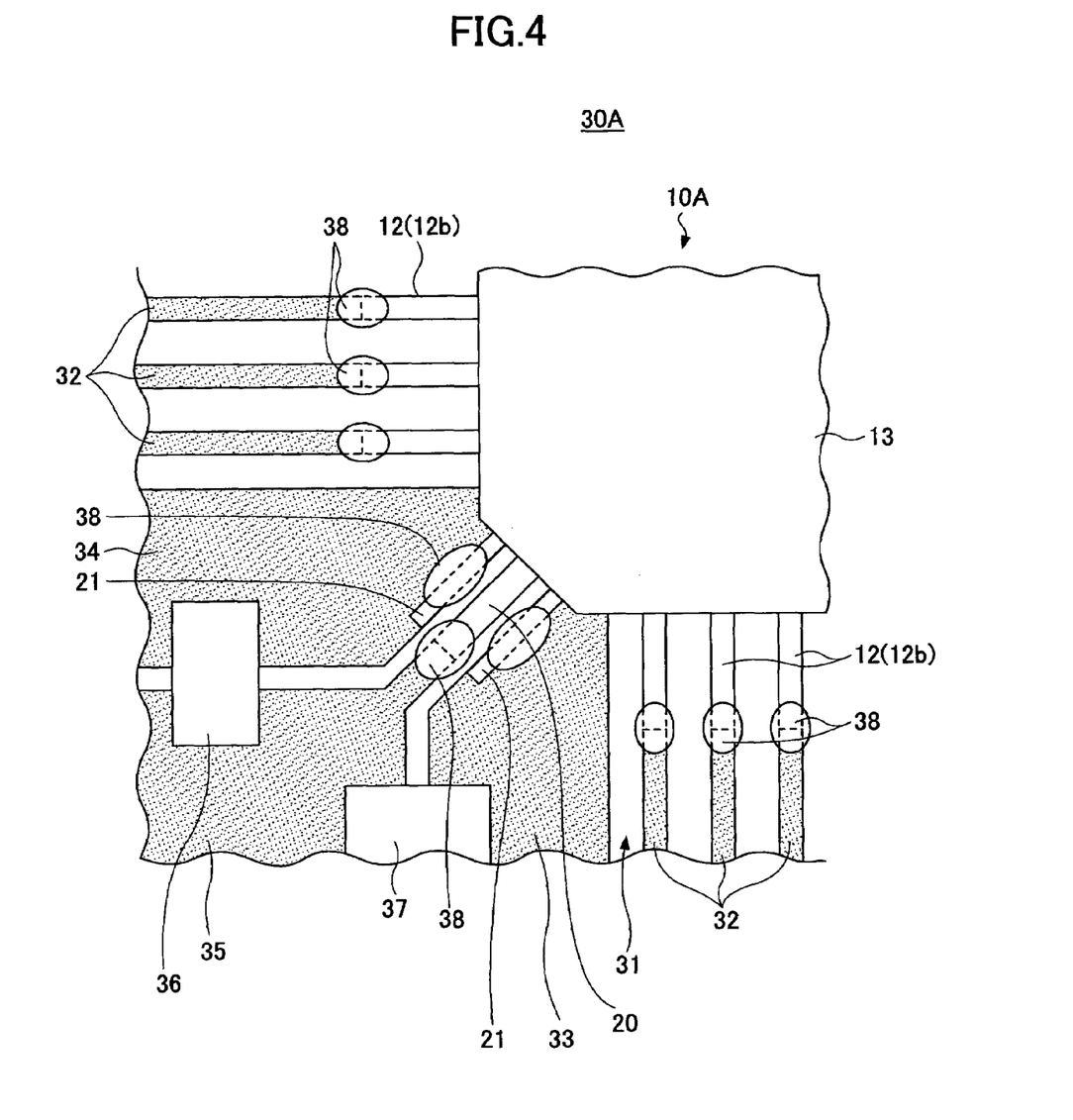
FIG. 4 is an expanded plan view of the principal part of the semiconductor device unit in the first preferred embodiment of the invention.

FIG. 4 shows the principal part of the semiconductor device unit 30A in the first preferred embodiment of the invention. The semiconductor device unit 30A is constructed in the composition that the above-described semiconductor device 10A is mounted on the mounting substrate 31.

The mounting substrate 31 is a printing wiring board, and the signal wiring 32, the power supply wiring 33 and 34, and the ground wiring 35 are formed on the surface of the mounting substrate 31.

The signal wiring 32 is formed such that the signal wiring 32 is connected to the leads 12 of the semiconductor device 10A by the solder 38, the power supply wiring 33 and 34 are formed such that the power supply wiring 33 and 34 are connected to the second corner leads 21 by the solder 38, and the ground wiring 35 is formed such that the ground wiring 35 is connected to the first corner leads 20 by the solder 38.

Moreover, the decoupling capacitor 37 which is used as the external addition circuit is disposed between the power supply wiring 33 and the ground wiring 35, and the decoupling capacitor 36 which is similarly used as the external addition circuit is disposed between the power supply wiring 34 and the ground wiring 35. The decoupling capacitors 36 and 37 are arranged in the vicinity of the positions of the first corner lead 20 and the second corner leads 21.

The decoupling capacitors 36 and 37 are provided to attain smoothing of the power supplied to the semiconductor device 10A and prevent inclusion of the power supply noise in the semiconductor device 10A. In addition, in order to more effectively attain smoothing of the power supplied to the semiconductor device 10A and prevent inclusion of the power supply noise in the semiconductor device 10A than in the conventional device, the decoupling capacitors 36 and 37 are arranged in the vicinity of the position of the vertex portion A of the semiconductor device 10A where the first corner lead 20 and the second corner leads 21 are arranged.

When mounting the semiconductor device 10A on the mounting substrate 31, the mounting is performed using the reflow soldering process. Namely, the paste-like solder is applied to the signal wiring 32, the power supply wiring 33 and 34, and the ground wiring 35, which are formed on the mounting substrate 31, and the semiconductor device 10A is placed on the solder applied. Thereby, the leads 12 are temporarily fixed to the signal wiring 32, the first corner lead 20 is temporarily fixed to the ground wiring 35, and the second corner leads 21 are temporarily fixed to the power supply wiring 33 and 34.

The mounting substrate 31 in the above-mentioned state is put into the reflow furnace so that the mounting substrate 31 is heated and the solder is melted. Thus, the semiconductor device 10A is mounted on the surface of the mounting substrate 31.

Next, the arrangement position of the decoupling capacitors 36 and 37 will be explained. As described above, the decoupling capacitors 36 and 37 are arranged in the vicinity of in the positions of the first and second corner leads 20 and 21 (which are near the position of the vertex portion A of the semiconductor device 10A). In the semiconductor device 10A, the vicinity of the arrangement position of the first and second corner leads 20 and 21 is the position where a comparatively large space can be used. Therefore, the arrangement of the decoupling capacitors 36 and 37 at this position does not cause the size of the semiconductor device unit 30A to be enlarged. Rather, the arrangement position of the decoupling capacitors 36 and 37 can be approached to the positions of the corner leads 20 and 21, and the impedance between the decoupling capacitors 36 and 37 the corner leads 20 and 21 can be reduced. Therefore, it is possible to attain improvement in the electrical properties of the semiconductor device unit 30A.

In addition, in the above-described embodiment, the printed wiring board is used as the mounting substrate 31. However, the mounting substrate 31 is not limited to the printed wiring board. Alternatively, any of resin substrate, ceramic substrate or other substrates may be used as the mounting substrate 31 according to the present invention. Moreover, it is also possible to use the double-sided substrate or the laminated wiring substrate.

Moreover, in the above-described embodiment, the decoupling capacitors 36 and 37 are provided as the external addition circuit. The external addition circuit is not limited to the decoupling capacitor. Alternatively, any of other addition circuits, such as a resistance, a coil and an antenna may be provided as the external addition circuit according to the present invention.

Next, a description will be given of the semiconductor device 10B in the second preferred embodiment of the invention.

Figure 5:
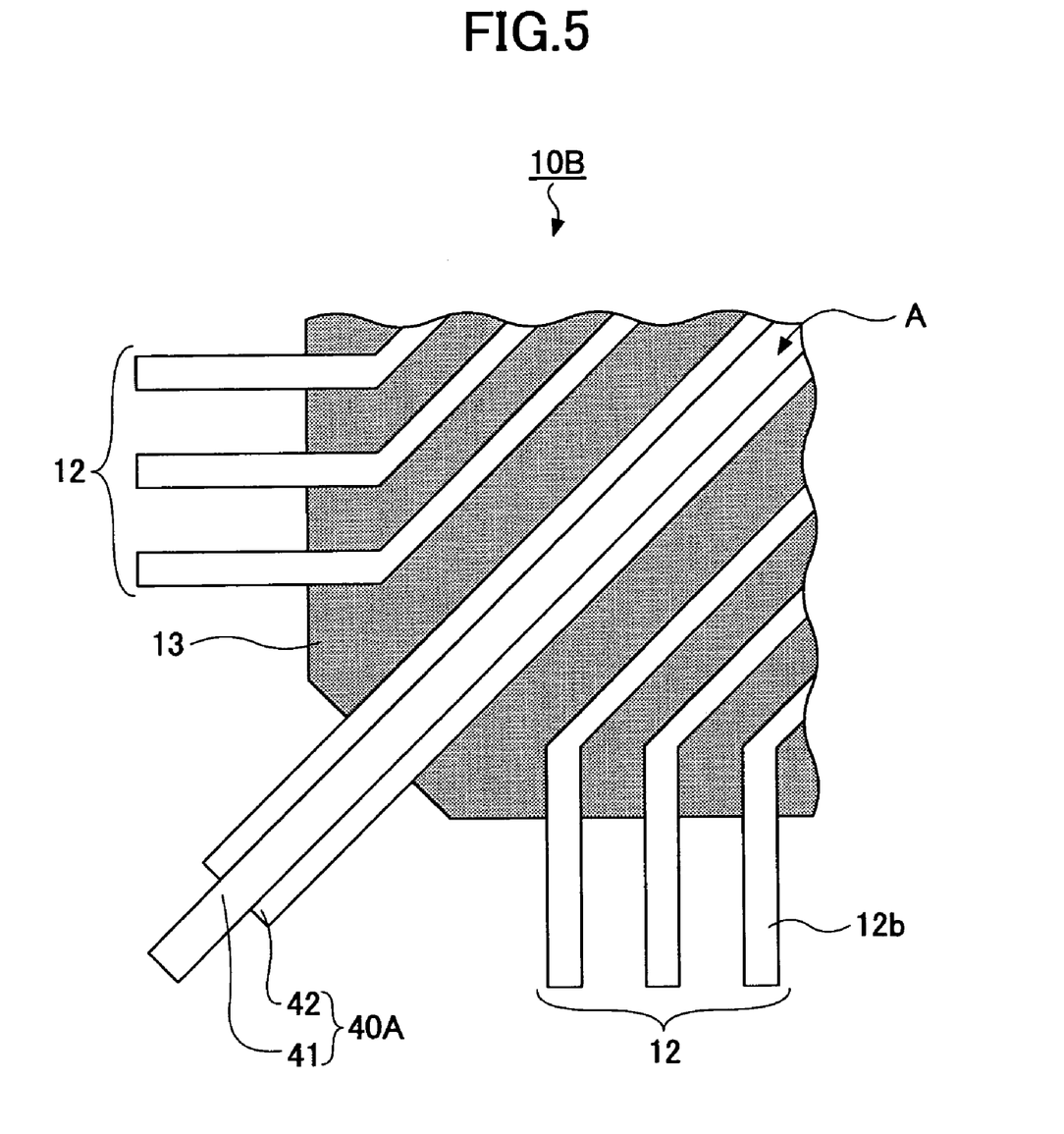
FIG. 5 is a diagram for explaining the arrangement of the leads at the vertex portion of the semiconductor device in the second preferred embodiment of the invention.
Figure 6:
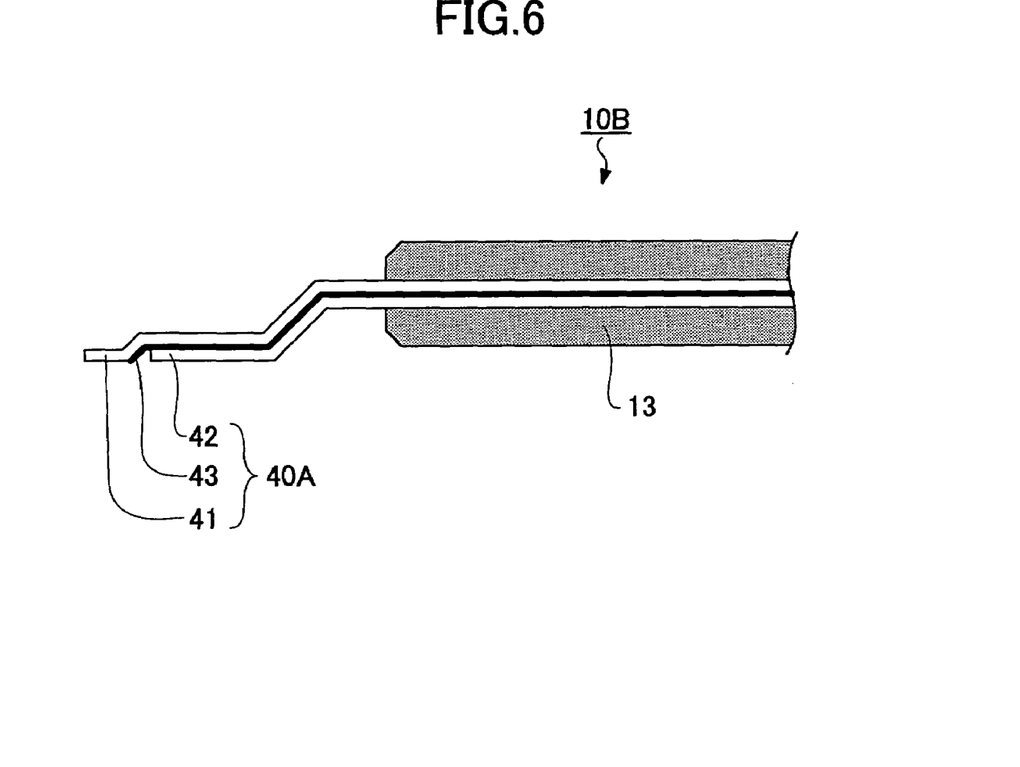
FIG. 6 is a cross-sectional view of the semiconductor device in the second preferred embodiment.

FIG. 5 is a diagram for explaining the arrangement of the leads at the vertex portion A of the semiconductor device 10B in the second preferred embodiment, and FIG. 6 is a cross-sectional view of the semiconductor device 10B in the vicinity of the vertex portion A.

In FIG. 5 and FIG. 6, the elements which are essentially the same as corresponding elements of the first preferred embodiment in FIG. 1, FIG. 2 and FIG. 3 are designated by the same reference numerals, and a description thereof will be omitted.

The semiconductor device 10B of this embodiment is provided so that only one corner lead 40A is outwardly extended from one of the corner portions of the resin package 13. This corner lead 40A comprises the upper lead portion 41 equivalent to the first corner lead 20 in the first preferred embodiment, the lower lead portion 42 equivalent to the second corner lead 21 in the first preferred embodiment, and the insulation layer 43 interposed between the upper lead portion 41 and the lower lead portion 42.

Namely, the corner lead 40A has the composition in which the upper lead portion 41 (first corner lead), connected with the stage 14, and the lower lead portion 42 (second corner lead), connected with the outer peripheral lead 15, are laminated with the insulation layer 43 interposed between the upper lead portion 41 and the lower lead portion 42.

Similar to the semiconductor device 10A of the first preferred embodiment, the semiconductor device 10B of this embodiment is also provided so that the corner lead 40A is arranged at the position (or one of the four corners of the stage 15) where a comparatively large space can be used. The width of the corner lead 40A can be made large, and the impedance of the corner lead 40A can be reduced, and it is possible to raise the electrical properties of the semiconductor device 10B.

Moreover, the corner lead 40A has the composition in which the upper lead portion 41 and the lower lead portion 42 are laminated with the insulation layer 43 therebetween, and in the semiconductor device 10B, the two leads (the upper lead portion 41 and the lower lead portion 42) can be arranged in the width corresponding to a single lead width (which is the width when viewing the semiconductor device from the top). Therefore, it is possible for the present embodiment to attain higher density arrangement of the leads.

Moreover, the leading edge of the corner lead 40A in the present embodiment will be taken into consideration. As shown in FIG. 5 and FIG. 6, the upper lead portion 41 and the lower lead portion 42 have different lengths at their leading edges. Specifically, the upper lead portion 41 is elongated at the leading edge when compared with the leading edge of the lower lead portion 42. Moreover, the corner lead 40A in the present embodiment is arranged so that the width of the lower lead portion 42 is larger than the width of the upper lead portion 41.

Thus, in the present embodiment, the length of the upper lead portion 41 is larger than the length of the lower lead portion 42, and the width of the lower lead portion 42 is larger than the width of the upper lead portion 41. Even when it has the composition in which the upper lead portion 41 and the lower lead portion 42 are laminated, the soldering positions of the upper lead portion 41 and the lower lead portion 42 can be separated from each other, and it is possible to attain easy soldering process of the corner lead 40A (or the mounting process to mount the semiconductor device 10B on the mounting substrate 31).

Figure 7:
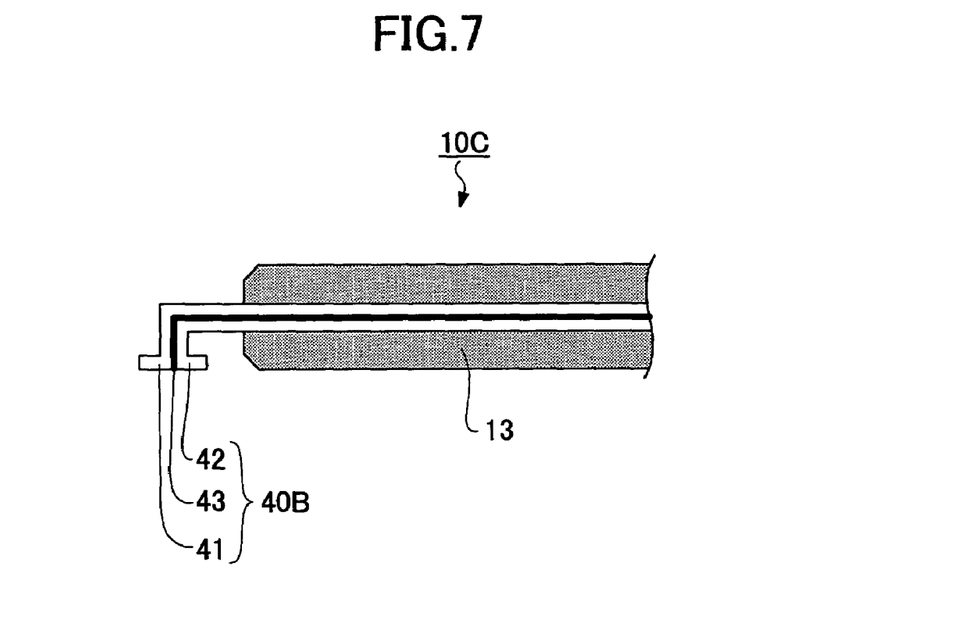
FIG. 7 is a cross-sectional view of the semiconductor device which is the modification of the second preferred embodiment.

Next, FIG. 7 shows the modification of the semiconductor device 10B in the second preferred embodiment shown in FIG. 6.

In FIG. 7, the elements which are essentially the same as corresponding elements in FIG. 6 are designated by the same reference numerals, and a description thereof will be omitted.

The semiconductor device 10C of this embodiment is characterized in that the corner lead 40B is arranged so that the upper lead portion 41 and the lower lead portion 42 have leading edges which are arranged in an L-shaped formation and are symmetrical with respect to the insulation layer 43.

The corner lead 40B in this embodiment is arranged in the state where the leading edge of the upper lead portion 41 and the leading edge of the lower lead portion 42 are extended in the mutually opposite directions from the position of the insulation layer 43. Therefore, the composition of this embodiment makes it possible to perform the soldering process of the corner lead 40B more easily.

Figure 8:
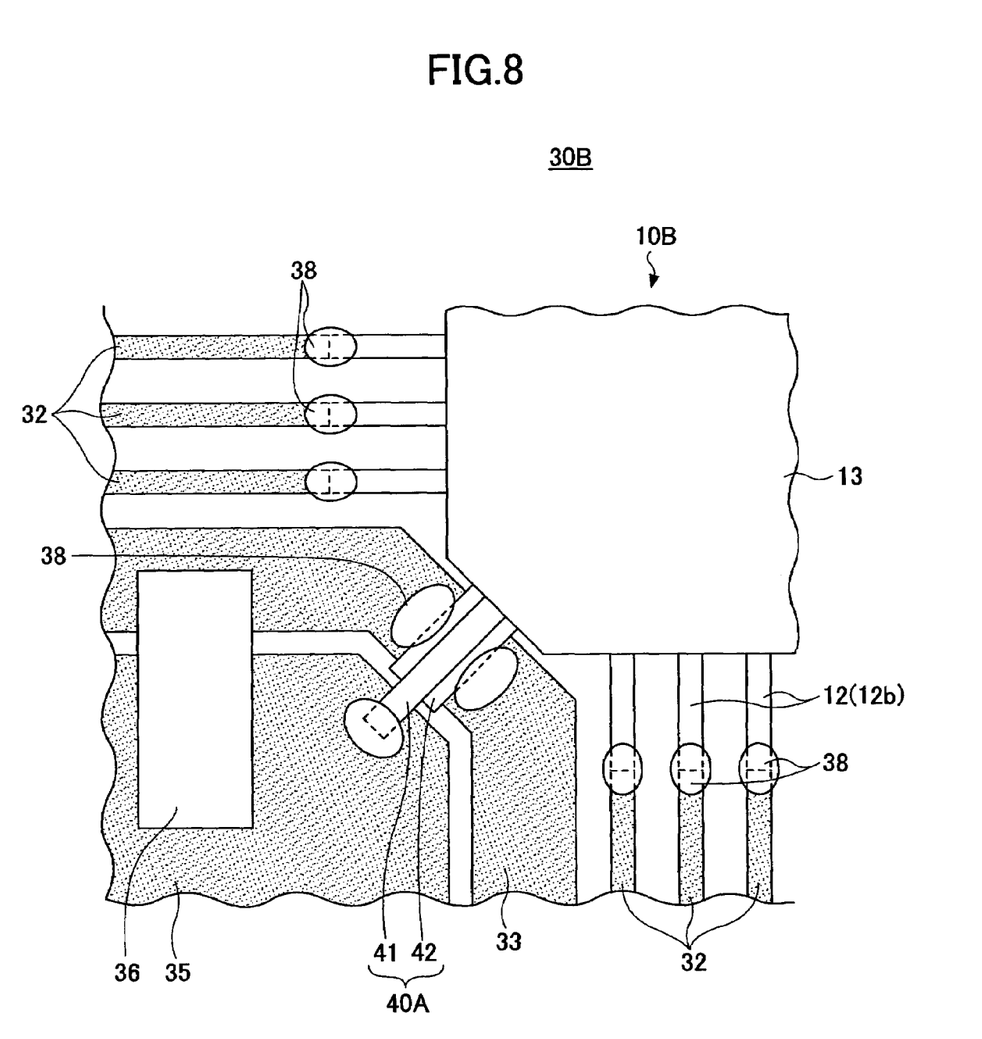
FIG. 8 is an expanded plan view of the principal part of the semiconductor device unit in the second preferred embodiment.

Next, FIG. 8 shows the semiconductor device unit 30B in the second preferred embodiment of the invention.

In FIG. 8, the elements which are essentially the same as corresponding elements of the semiconductor device unit 30A of the first preferred embodiment shown in FIG. 4 are designated by the same reference numerals, and a description thereof will be omitted.

The semiconductor device unit 30B of this embodiment is constructed in the composition that the above-described semiconductor device 10B of the second preferred embodiment is mounted on the mounting substrate 31.

In the present embodiment, the corner lead 40A is bonded to the mounting substrate 31 through the soldering such that the rightward and leftward extended portions of the lower lead portion 42 on both the sides of the upper lead portion 41 are secured to the power supply wiring 33 by the solder 38. Moreover, the extended portion of the upper lead portion 41 which is extended from the leading edge of the lower lead portion 42 is soldered to the ground wiring 35. Therefore, the soldering of the semiconductor device 10B to the mounting substrate 31 can be performed easily.

Moreover, a comparatively large space which is larger than that in the first preferred embodiment can be used at the position of the semiconductor device unit 30B which is in the vicinity of the corner lead 40A. This makes it possible to arrange the decoupling capacitor 36 with a comparatively large size (that is, the capacity of the capacitor 36 is large) in this position. Therefore, with the use of the decoupling capacitor 36, it is possible for the semiconductor device unit 30B of the present embodiment to more effectively attain smoothing of the power supplied to the semiconductor device 10B and prevent inclusion of the power supply noise in the semiconductor device 10B.

The present invention is not limited to the above-described embodiments, and variations and modifications may be made without departing from the scope of the present invention.

What is claimed is:

1. A semiconductor device comprising:
   a semiconductor chip mounted on a stage;
   a plurality of leads electrically connected with the semiconductor chip;
   a package enclosing the semiconductor chip and a part of the plurality of leads; and
   a first corner lead provided in the stage and outwardly extending from at least one of vertex portions at four corners of the stage to an exterior of the package;
   an outer peripheral lead surrounding an outer periphery of the stage; and
   a second corner lead provided in the outer peripheral lead and outwardly extending to the exterior of the package from a position of the outer peripheral lead corresponding to said at least one of vertex portions of the stage.

2. The semiconductor device according to claim 1 wherein the first corner lead is used as either a power-supply lead or a ground lead.

3. The semiconductor device according to claim 1 wherein the first corner lead and the second corner lead are arranged side by side so that the first corner lead and the second corner lead are flush with the stage.

4. The semiconductor device according to claim 1 wherein the first corner lead and the second corner lead are laminated with an insulation layer interposed between the first corner lead and the second corner lead.

5. The semiconductor device according to claim 4 wherein the first corner lead and the second corner lead have different lengths at their leading edges.

6. The semiconductor device according to claim 4 wherein the first corner lead and the second corner lead have leading edges which are arranged in an L-shaped formation and are symmetrical with respect to the insulation layer.

7. A semiconductor device unit including a semiconductor device, a mounting substrate, and an external addition circuit, the semiconductor device comprising:
- a semiconductor chip mounted on a stage;
- a plurality of leads electrically connected with the semiconductor chip;
- a package enclosing the semiconductor chip and a part of the plurality of leads;
- a first corner lead provided in the stage and outwardly extending from at least one of vertex portions at four corners of the stage to an exterior of the package;
- an outer peripheral lead surrounding an outer periphery of the stage; and
- a second corner lead provided in the outer peripheral lead and outwardly extending to the exterior of the package from a position of the outer peripheral lead corresponding to said at least one of vertex portions of the stage;
- wherein the semiconductor device is mounted on the mounting substrate, and the external addition circuit is arranged on the mounting substrate in a vicinity of the first corner lead of the semiconductor device and connected to the semiconductor chip.

8. The semiconductor device unit according to claim 7 wherein the external addition circuit is a decoupling capacitor.

* * * * *